United States Patent
Hsu (10) Patent No.: US 9,768,150 B2
(45) Date of Patent: Sep. 19, 2017

(54) LED DISPLAY AND METHOD FOR MANUFACTURING THE SAME

(71) Applicant: EPISTAR CORPORATION, Hsinchu (TW)

(72) Inventor: Chia-Liang Hsu, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 0 days.

(21) Appl. No.: 14/670,900

(22) Filed: Mar. 27, 2015

(65) Prior Publication Data

US 2015/0279822 A1    Oct. 1, 2015

Related U.S. Application Data

(60) Provisional application No. 61/973,486, filed on Apr. 1, 2014.

(51) Int. Cl.
| | |
|---|---|
| *H01L 33/00* | (2010.01) |
| *H01L 25/075* | (2006.01) |
| *H01L 25/00* | (2006.01) |
| H01L 33/50 | (2010.01) |
| H01L 33/62 | (2010.01) |
| H01L 33/48 | (2010.01) |

(52) U.S. Cl.
CPC .......... *H01L 25/0753* (2013.01); *H01L 25/50* (2013.01); *H01L 33/483* (2013.01); *H01L 33/50* (2013.01); *H01L 33/62* (2013.01); *H01L 2224/48091* (2013.01); *H01L 2224/48095* (2013.01); *H01L 2224/49107* (2013.01); *H01L 2224/73265* (2013.01)

(58) Field of Classification Search
CPC ........... H01L 2924/12041; H01L 33/62; H01L 33/502; H01L 33/504; H01L 25/0753; H01L 33/507; H01L 33/483; H01L 33/50; H01L 25/50
USPC ....................................................... 257/88, 89
See application file for complete search history.

(56) References Cited

U.S. PATENT DOCUMENTS

| | | | | | |
|---|---|---|---|---|---|
| 8,564,507 | B2* | 10/2013 | Jang | ....................... | G09G 3/342 345/102 |
| 2008/0258695 | A1* | 10/2008 | Kumar | ............... | H05B 33/0818 323/223 |
| 2009/0284174 | A1* | 11/2009 | Sauerlander | ....... | H05B 33/0803 315/294 |
| 2010/0026191 | A1* | 2/2010 | Radermacher | ..... | H05B 33/0815 315/149 |
| 2010/0237361 | A1* | 9/2010 | Sakai | ................. | C09K 11/7734 257/88 |
| 2012/0313117 | A1* | 12/2012 | Lee | ..................... | H01L 25/0753 257/88 |

* cited by examiner

*Primary Examiner* — Thien F Tran
(74) *Attorney, Agent, or Firm* — Muncy, Geissler, Olds & Lowe, P.C.

(57) ABSTRACT

An LED display comprises a first end providing a current, a second end receiving the current, a first LED chip, electrically connected between the first end and the second end, emitting a first light, and a second LED chip, emitting a second light, electrically connected to the first end and is insulated from the second end. The current flows from the first end and through the first LED chip to the second end.

14 Claims, 9 Drawing Sheets

FIG. 1

(Prior Art)

FIG. 2

(Prior Art)

LED DISPLAY AND METHOD FOR MANUFACTURING THE SAME

CROSS-REFERENCE TO RELATED APPLICATIONS

This application claims priority to and the benefit of a U.S. Provisional Application Series No. 61/973,486 filed on Apr. 1, 2014, which is incorporated by references in its entirety.

BACKGROUND

Technical Field

The present disclosure relates to an LED unit with a plurality of LED chips and the LED unit is one employed principally for an LED display.

Description of the Related Art

The light radiation theory of light emitting diode (LED) is to generate light from the energy released by the electron moving between an n-type semiconductor and a p-type semiconductor. Because the light radiation theory of LED is different from the incandescent light which heats the filament, the LED is called a "cold" light source. Moreover, the LED is more sustainable, longevous, light and handy, and less power-consumption, therefore it is considered as a new light source for the illumination markets. The LED applies to various applications like the traffic signal, backlight module, street light, and medical instruments, and is gradually replacing the traditional lighting sources.

Figure 1:
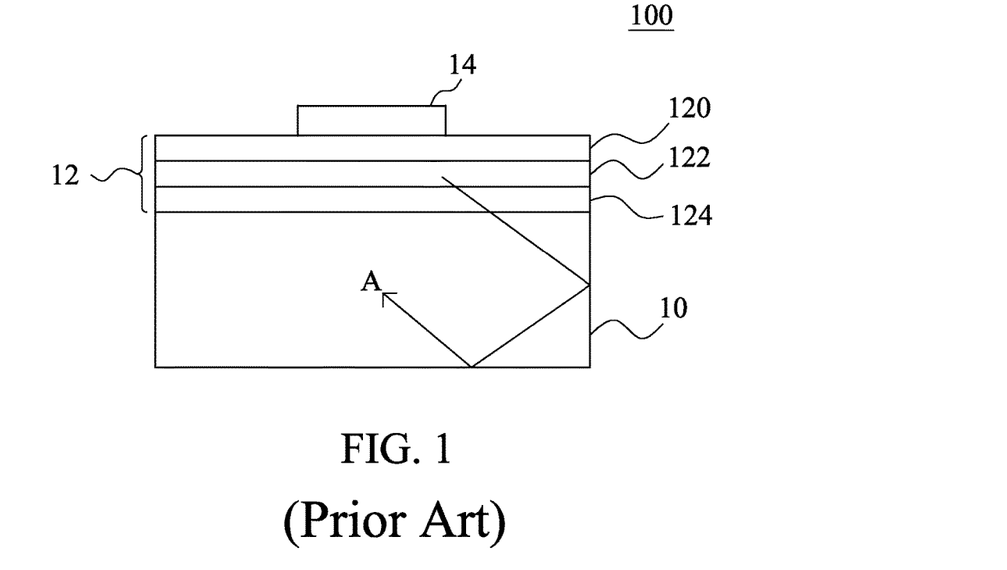
FIG. 1 illustrates the structure of a conventional light-emitting device.

FIG. 1 illustrates the structure of a conventional light-emitting device 100 which includes a transparent substrate 10, a semiconductor stack layer 12 formed above the transparent substrate 10, and an electrode 14 formed above the semiconductor stack layer 12, wherein the semiconductor stack layer 12 comprises a first conductive-type semiconductor layer 120, an active layer 122, and a second conductive-type semiconductor layer 124.

Figure 2:
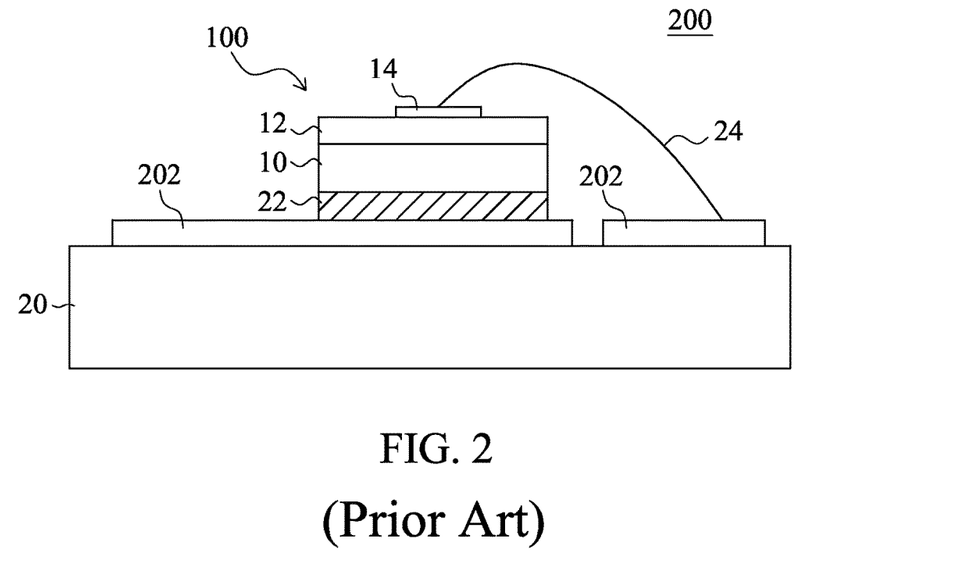
FIG. 2 illustrates the structure of a conventional light-emitting apparatus.

In addition, the light-emitting device 100 can be further connected to other components in order to form a light-emitting apparatus. FIG. 2 illustrates a conventional light-emitting apparatus including a sub-mount 20 carrying an electrical circuit 202, a solder 22 formed above the sub-mount 20; wherein the light-emitting device 100 is bonded to the sub-mount 20 and is electrically connected to the electric circuit 202 on the sub-mount 20 by the solder 22, and an electrical connection structure 24 that electrically connects the electrode 14 of the light-emitting device 100 with the electric circuit 202 on the sub-mount 20. The sub-mount 20 may be a lead frame or a large size mounting substrate in order to facilitate circuit design and enhance heat dissipation.

BRIEF DESCRIPTION OF DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE PREFERRED EMBODIMENTS

Reference is made in detail to the preferred embodiments of the present application, examples of which are illustrated in the accompanying drawings. Wherever possible, the same reference numbers are used in the drawings and the description to refer to the same or like parts.

The present disclosure describes an light-emitting device and a method of fabricating the light-emitting device. In order to have a thorough understanding of the present disclosure, please refer to the following description and the illustrations of FIG. 3A to FIG. 6B.

Figure 3A:
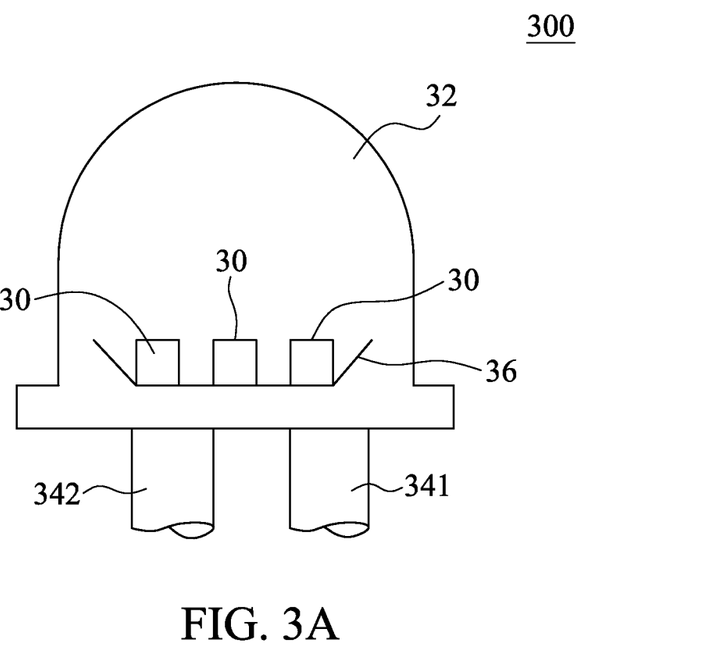
FIG. 3A illustrates a schematic diagram of an LED unit of this application.

FIG. 3A illustrates an LED unit 300 with a plurality of LED chips 30 formed on a submount 36. The LED unit 300 is one employed principally for an LED display. The LED unit 300 further includes a lens 32 for sealing at least three LED chips 30, and a first lead 341 and a second lead 342 for connecting the LED chips 30 to a board or a power source. In one embodiment, a wavelength conversion material (not shown), such as phosphor can be added inside or on the lens 32 to change the emitting color of the LED chips 30. In another embodiment, a phosphor can be coated on the LED chip 30, or made as phosphor sheets (not shown) and then arranged on one or more LED chips 30. Moreover, the LED chips 30 can be controlled individually, that is, the LED unit 300 is operated to emit light by turning on one LED chip 30 or turning on multiple LED chips 30. Besides, the LED chips 30 in the LED unit 300 are designed to emit a single color light or variant color lights. Furthermore, the LED chips 30 can emit lights with single or variant dominant or peak wavelengths.

Figure 3B:
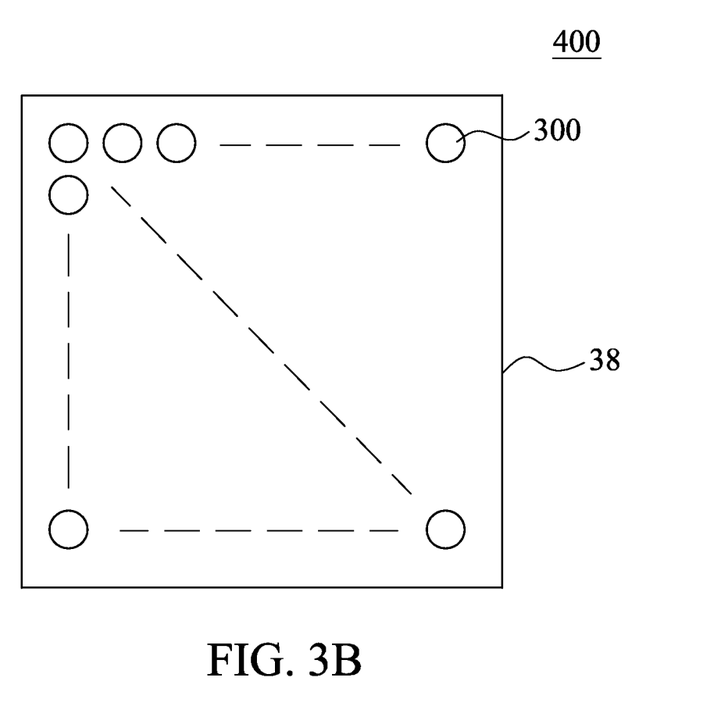
FIGS. 3B-3C illustrate schematic diagrams of an LED display of this application.
Figure 3C:
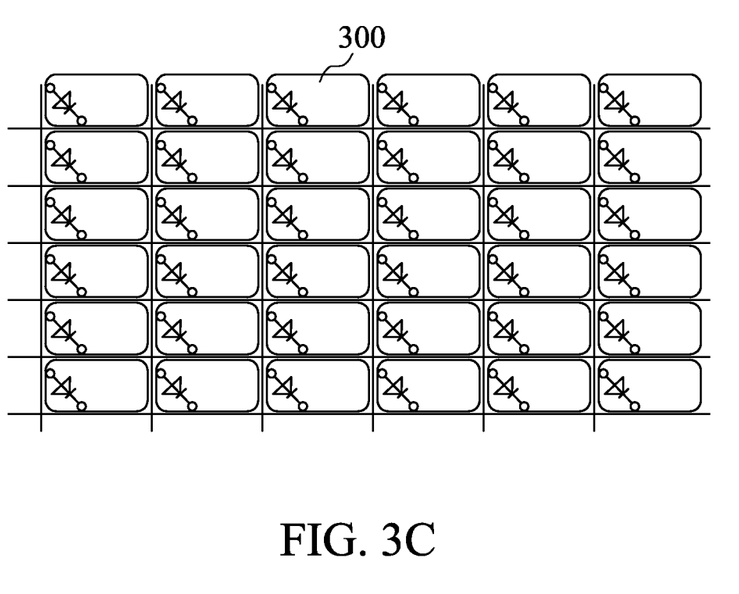

FIGS. 3B-3C illustrate an LED display 400 in which a plurality of the LED units 300 is arranged in a matrix and its circuitry is shown in FIG. 3C. The LED unit 300 can be structured in a horizontal form and/or in a vertical form on a board 38 according to the position of the electrode of the LED unit 300, and the quantity of the LED units 300 in the LED display 400 can be adjusted according to a specific requirement. Though the LED display 400 in the FIG. 3B is in a rectangular shape, the LED display 400 can also have a shape of a square, a circle, or a polygon. Besides, the LED display 400 has a cover pervious to light emitted from the LED units 300. The cover can have a flat surface or a bended surface, and the cover is transparent or translucent to the light emitted from the LEDs.

Figure 4A:
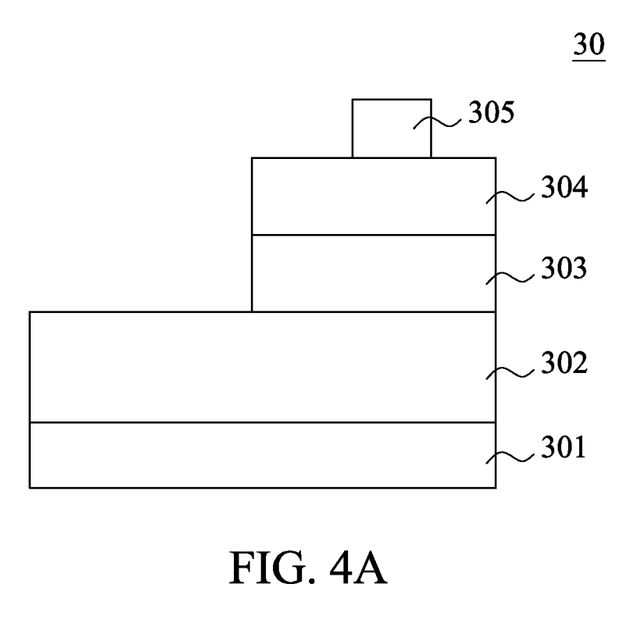
FIG. 4A illustrates a schematic diagram of an LED chip of this application.

FIG. 4A illustrates one example of the LED chips 30 in the LED unit 300. A substrate 301 is provided and a first conductivity semiconductor layer 302, an active layer 303, and a second conductivity semiconductor layer 304 are formed on the substrate 301 subsequently. A first electrode 305 can be formed on the second conductivity semiconductor layer 304 to form the LED chip 30. A second electrode (not shown) can be formed on the first conductivity semiconductor layer 302 or on the substrate 301.

In one embodiment, a further active layer (not shown) can be formed on the second conductivity semiconductor layer 304. The active layer 303 and further active layer (not shown) can emit lights with the same or different colors. The active layer 303 and further active layer can emit an incoherent light.

Figure 4B:
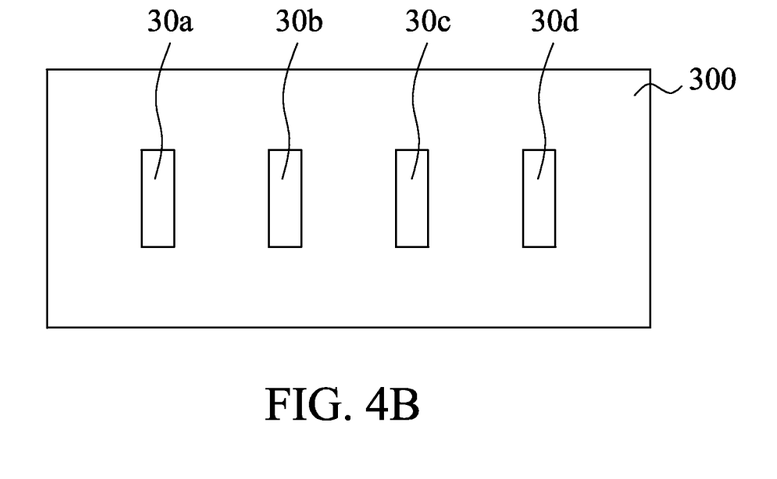
FIGS. 4B-4E illustrate schematic diagrams of a first embodiment of the arrangement of a plurality of LED chips in an LED unit.

FIG. 4B illustrates a schematic diagram of the first embodiment of the arrangement of a plurality of LED chips in an LED unit 300. In this embodiment, four LED chips 30a, 30b, 30c and 30d are arranged in one LED unit 300. The four LED chips 30a, 30b, 30c and 30d can be divided into two groups, three of the LED chips 30a, 30b, 30c are selected to be working LED chips to emit different colors of light, such as red, green and blue light, and the different colors of light of the LED chips 30a, 30b and 30c can be an original light emitted from active layers of the LED chips. In one embodiment, each of the LED chips emits a first light, such as blue or UV light. The first light emitted by part or all of the LED chips can be adjusted by different wavelength conversion materials, such phosphor coating or phosphor sheet on LED chips, absorbing the first light emitted by LED chips 30a, 30b and/or 30c, and emitting second light with a wavelength spectrum different from that of the first light, such as red, yellow or green light. In this embodiment, the light emitted from the LED chips 30a, 30b, 30c are blue, green, and red respectively.

In another embodiment, the working LED chips 30a, 30b, 30c are selected to emit a monochromatic color light, such as blue light for a single color display. In another embodiment, the lights emitted from the LED chips 30a, 30b and 30c have the same color, which can be further transferred by a wavelength conversion material to a different color light, such as red, green or blue.

The LED chip 30d is set for a preparative LED chip. When one of the working LED chips 30a, 30b, and 30c is detected in a failure mode, the preparative LED chip 30d can be configured to illuminate to replace the failure working LED chip so the LED units 300 can keep working normally and correctly.

Figure 4C:
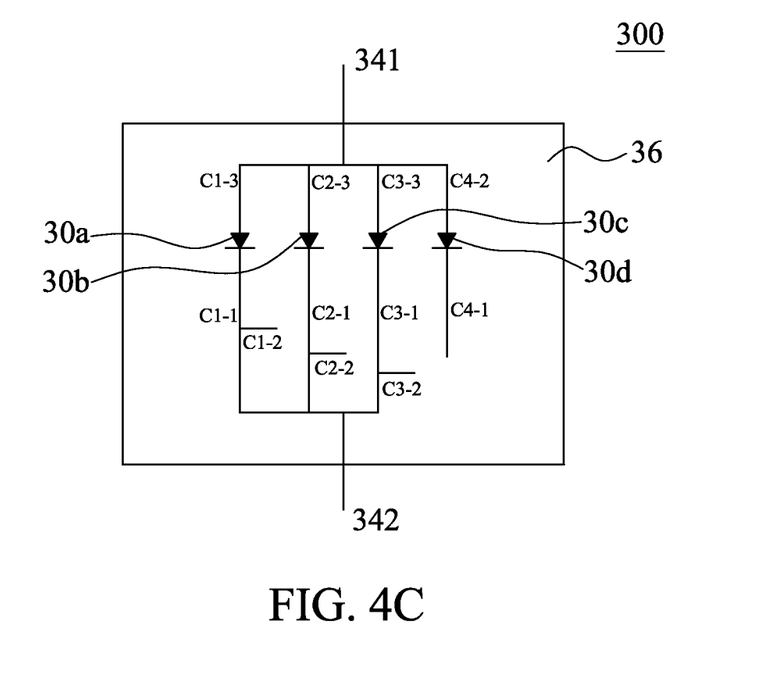
Figure 4D:
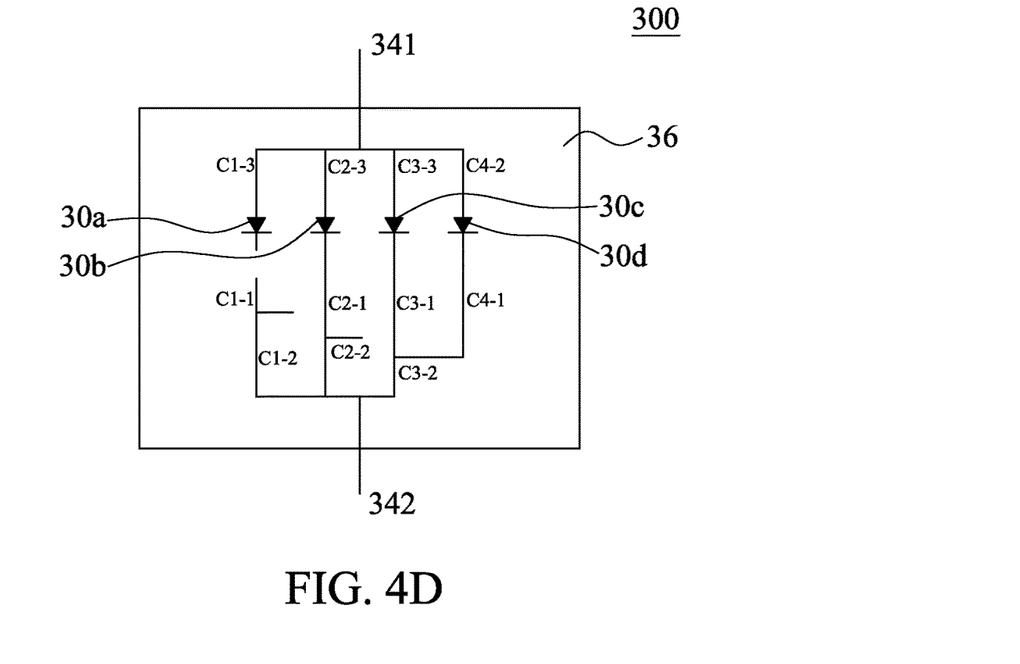
Figure 4E:
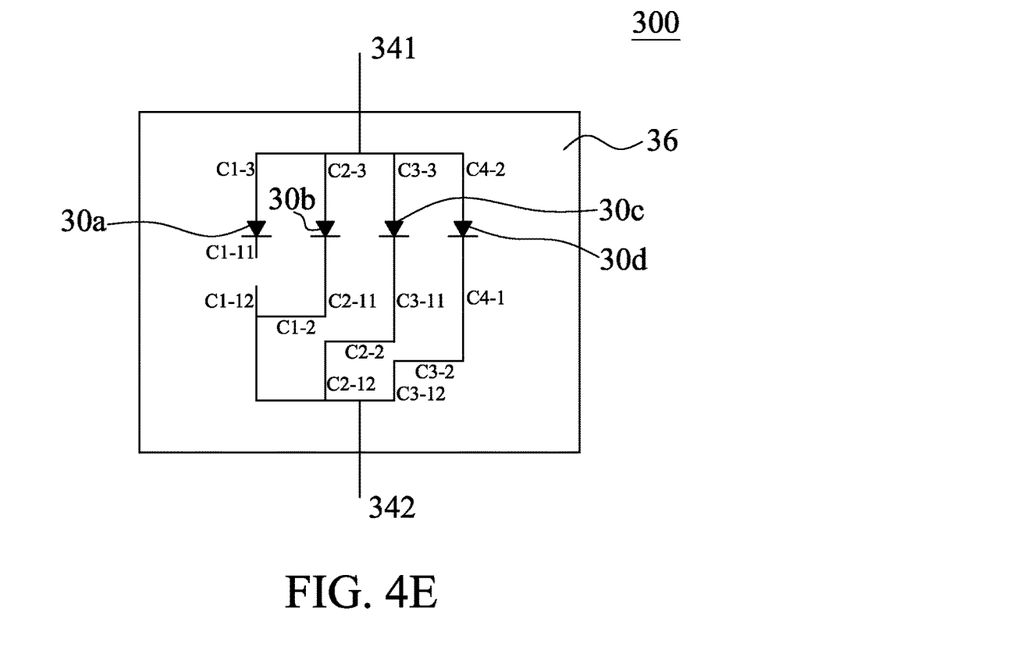

Following, FIGS. 4C-4E is further explanation of how the preparative LED chip replaces the failure working LED chip 30a, 30b, or 30c in detail. FIG. 4C illustrates a normal circuitry of the LED units 300 placed on the submount 36. A first working LED chip 30a is connected to a first wire c1-1 and a second wire c1-3, and the first wire c1-1 has an extension c1-2.

A second LED chip 30b is connected to the third wire c2-1 and a fourth wire c2-3, and the extension c1-2 is not connected to the third wire c2-1, which is an open circuit between the extension c1-2 and the third wire c2-1. The third wire c2-1 has an extension c2-2, and the extension c2-2 is not connected to a fifth wire c3-1, which is an open circuit between the extension c2-2 and the fifth wire c3-1. A third LED chip 30c is connected to the fifth wire c3-1 and a sixth wire c3-3, and the fifth wire c3-1 has an extension c3-2, and the extension c3-2 is not connected to a seventh wire c4-1, which is an open circuit between the extension c3-2 and the seventh wire c4-1. The preparative LED chip 30d is connected to the seventh wire c4-1 and an eighth wire c4-2.

The first wire c1-1, the third wire c2-1, and the fifth wire c3-1 connected to the working LED chips 30a, 30b, 30c are connected to the second lead 342 in parallel. The second wire c1-3, the fourth wire c2-3, and the sixth wire c3-3 connected to the working LED chips 30a, 30b, 30c are connected to the first lead 341 for the electrically connection of the working LED chips 30a, 30b, and 30c in parallel. The eighth wire c4-2 is also connected to the first lead 341 in parallel.

FIG. 4D illustrates the first example to form a replacing circuitry. When one working LED chip, for example the first working LED chip 30a is detected in a failure mode, such as short or open, the electrical connection of the first working LED chip 30a is designed to be cut off to maintain LED chips 30b and 30c working. Then the first working LED chip 30a is replaced by the preparative LED chip 30d through electrical connecting to the first and the second leads 341, 342 to maintain the function of the LED unit 300.

The circuit between the seventh wire c4-1 of the preparative LED chip 30d and the extension c3-2 of the fifth wire is rewired and connected to the second lead 342 to form the electrical connection of the preparative LED chip 30d with the working LED chips 30b, 30c.

FIG. 4E illustrates the second example of forming a replacing circuitry. When one working LED chips, for example the first working LED chip 30a is detected in a failure mode, such as short, the electrical connection of the first working LED chip 30a is designed to be cut off. An electrical connection between the preparative LED chip 30d, the first and the second leads 341, 342 is formed to replace the first working LED chip 30a.

The arrangement of the electrical connections of the LED chips 30a, 30b, 30c, 30d are as followed. The first wire c1-1 is designed to be cut off and separated into an upper portion c1-11 and a lower portion c1-12 to cut off the electrical connection between the first working LED chip 30a and the second lead 342. Part of the third wire c2-1 is designed to be cut off and separated into an upper portion c2-11 and a lower portion c2-12 to cut off the electrical connection between the second working LED chip 30b and the second lead 342, and the second working LED chip 30b is connected to the lower portion c1-12 of the first wire by rewiring. The extension of the first wire c1-2 and the upper portion c2-11 of the third wire are connected to form an electrical connection of the second working LED chip 30b.

Part of the fifth wire c3-1 is designed to be cut off and separates the fifth wire c3-1 into an upper portion c3-11 and a lower portion c3-12 to cut off the electrical connection between the third working LED chip 30c and the second lead 342 and the third working LED chip 30c is connected to the lower portion c2-12 of the third wire by rewiring. The extension c2-2 of the third wire and the upper portion c3-11 of the fifth wire are connected to form the electrical connection of the third working LED chip 30c.

The extension c3-2 of the fifth wire and the seventh wire c4-1 are rewired to connect with each other. The preparative LED chip 30d is electrically connected to the lead 342 to replace the first working LED chip 30a and maintain the function of the LED unit 300. The lower portions c1-12, c2-12 and c3-12 are connected to the lead 342 in parallel.

In one embodiment, the wires are disposed on the submount 36. The wires can be connected by rewiring process. The method of rewiring includes microjet printing or focused ion beam (FIB) circuit repair. The wires can be cut off by a laser trimming or FIB.

In one embodiment, the failure of the working LED chip 30a, 30b, 30c can be detected by a detection device (not shown) such as probe card, optical inspection after the LED chips 30a, 30b, 30c, 30d formed on the submount 36 with circuit.

Besides of forming the electrical connection of the preparative LED chip 30d, the light-emitting color of the preparative LED chip 30d also need to be changed to be the same with the light-emitting color of the first working LED 30a to replace the first working LED 30a. The light-emitting color of the preparative LED chip 30d can be adjusted by wavelength conversion materials formed on the preparative LED chip 30d.

In one embodiment, a bridge rectifier may alternatively form on the submount 36 to receive the alternating current (AC) provided. The rectifier may rectify the AC to direct current (DC). A zener diode may alternatively be set to breakdown at a voltage level higher than a working voltage of the LED chips 30a, 30b, 30c, 30d. The voltage of the zener diode may be set to a level such that the diode will only turn on when the voltage provided by the ballast exceeds the sum of the voltage stack-up of the nominal closed circuit components at their absolute maximum voltage ratings.

In one embodiment, the LED unit 300 can include a plurality of the preparative LED chips and a plurality of the working LED chips. When the second or third working LED chips 30b, 30c are failed, the preparative LED chip 30d can also replace the failure LED chips by the way exemplified above to make the LED unit 300 keep working normally and correctly. The number of the preparative LED chips is corresponded to the number of the working LED chips.

In one embodiment, one or more switches can be arranged between the LED chips and the first lead 341 or arranged between the LED chips and the second lead 342. Such that, each of the LED chips can be individually controlled by corresponding switch. For example, referring to FIG. 4E, a switch can be formed between the second lead 342 and the extension c1-2. The switch cane be also formed between the second wire c1-3 and the first lead 341. Therefore, the LED unit 300 can be controlled by switches between LED chips 30a~30c and the first lead 341 (or second lead 342), and by controlling switches between 30b~30d and the first lead 341 (or second lead 342) while the seventh wire c4-1 is formed and the first wire c1-1 is cut off. One switch can be configured to control one corresponding LED chip; or, one switch can be formed between one lead and two LED chips, such that, the switch can control the two connected LED chips. For example, a switch has one end connected to the first lead 341 and a second end connected to the first working LED chips 30a and the preparative LED chip 30d. When the first working LED chips 30a works functionally, referring to FIG. 4C, the switch is used to turn on or turn off the first working LED chips 30c. Once the first working LED chips 30a fails, referring to FIG. 4D, the switch is used to turn on or turn off the preparative working LED chip 30d.

Figure 5A:
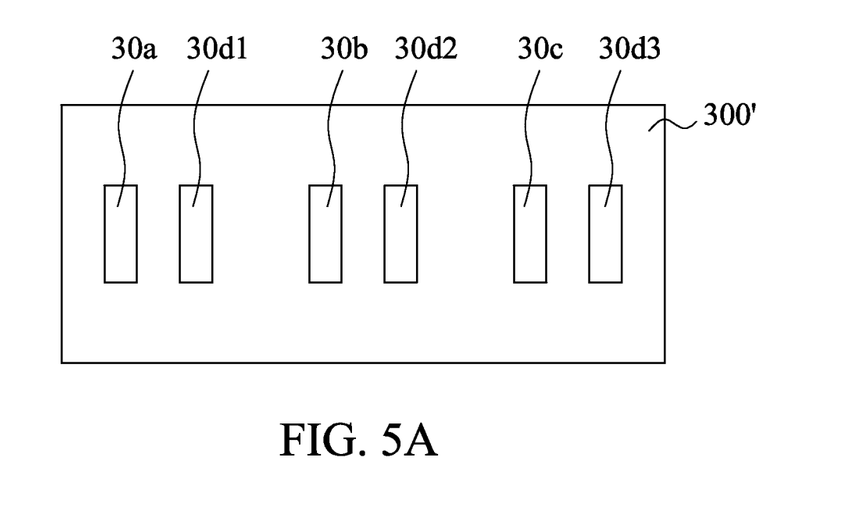
FIGS. 5A-5F illustrate schematic diagrams of a second embodiment of the arrangement of a plurality of LED chips in an LED unit.

The preparative LED chip, such as LED chip 30d, in an LED unit can be arranged near the edge of an LED unit as shown in FIGS. 4B~4E. In another embodiment, the preparative LED chip can be arranged near the center of an LED unit. Furthermore, the preparative LED chip can be a LED chip with a single light-emitting cell or multiple light-emitting cells. FIG. 5A illustrates a schematic diagram of the arrangement of a plurality of LED chips in an LED unit 300' according to a second embodiment. In this embodiment, the working LED chips 30a, 30b, 30c are divided into three groups, and each group contains at least one working LED chip and one preparative LED chip. The working LED chip and the preparative LED chip of each group are selected to emit the same color of light. The working LED chips 30a, 30b, 30c in each group and their corresponding preparative LED chips are selected to emit different colors of light, such as red, green and blue light. For example the working LED chip 30a and the preparative LED chip 30d1 are selected to emit red light, the working LED chip 30b and the preparative LED chip 30d2 emit green light and the working LED chip 30c and the preparative LED chip 30d3 emit blue light. The different colors of light of the LED chips can be an original light directly emitted from the LED chips. In one embodiment, each of the LED chips emits a first light, such as blue or UV light. The first light emitted by part or all of the LED chips can be adjusted by different wavelength conversion materials, such as phosphor coating or phosphor sheet on LED chips, absorbing the first light emitted by LED chips and emitting second light with wavelength spectrums different from that of the first light, such as red, yellow and green light.

Figure 5B:
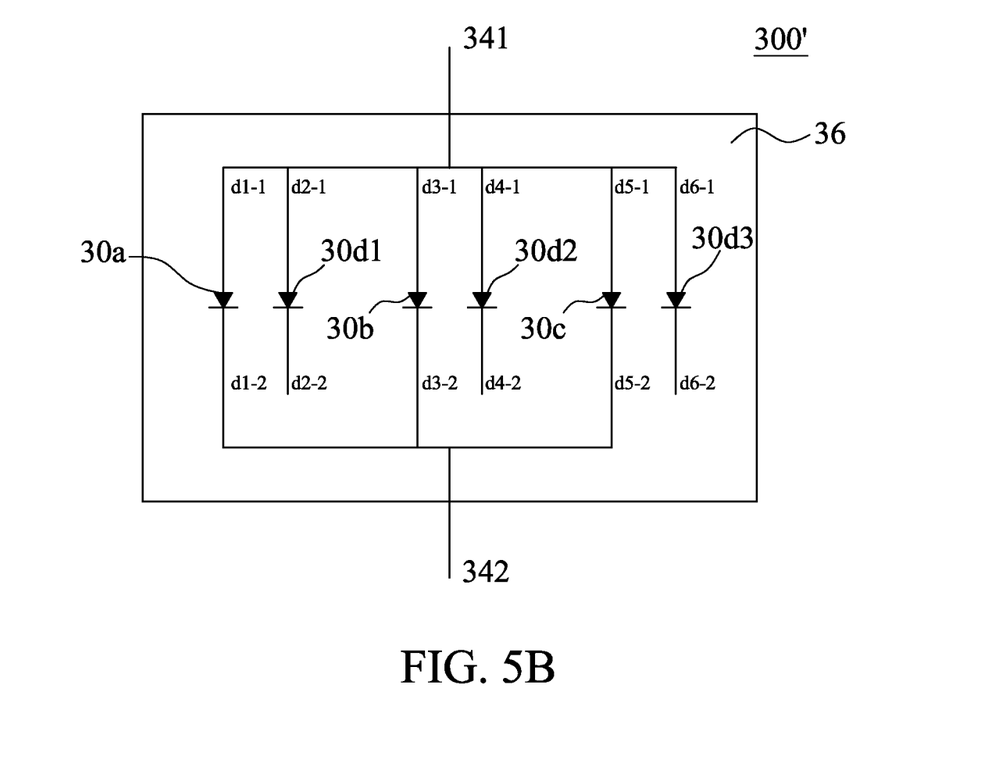

FIG. 5B illustrates the normal circuitry of the LED units 300' placed on the submount 36. The first working LED chip 30a and the first preparative LED chip 30d1 of the first group emit a first color of light. The first working LED chip 30a is connected to a first wire d1-1 and a second wire d1-2. The first preparative LED chip 30d1 is connected to a third wire d2-1 and a fourth wire d2-2.

The second working LED chip 30b and the second preparative LED chip 30d2 of the second group emit a second color of light. The second working LED chip 30b is connected to a fifth wire d3-1 and a sixth wire d3-2, and the second preparative LED chip 30d2 is connected to a seventh wire d4-1 and an eighth wire d4-2.

The third working LED chip 30c and the third preparative LED chip 30d3 of the third group emit a third color of light. The third working LED chip 30c is connected to a ninth wire d5-1 and a tenth wire d5-2. The third preparative LED chip 30d3 is connected to an eleventh wire d6-1 and a twelve wire d6-2.

The first working LED chips 30a, the second working LED chips 30b, the third working LED chips 30c, the first preparative LED chip 30d1, the second preparative LED chip 30d2 and the third preparative LED chip 30d3 are parallel connected to the first lead 341 via the first wire d1-1, the third wire d2-1, the fifth wire d3-1, the seventh wire d4-1, the ninth wire d5-1 and the eleventh wire d6-1.

The first working LED chips 30a, the second working LED chips 30b, and the third working LED chips 30c are parallel connected to the second lead 342 via the second wire d1-2, the sixth wire d3-2 and the tenth wire d5-2. The circuits between the second lead 342 and the fourth wire d2-2, the eighth wire d4-2 and the twelve wire d6-2 are opened.

Figure 5C:
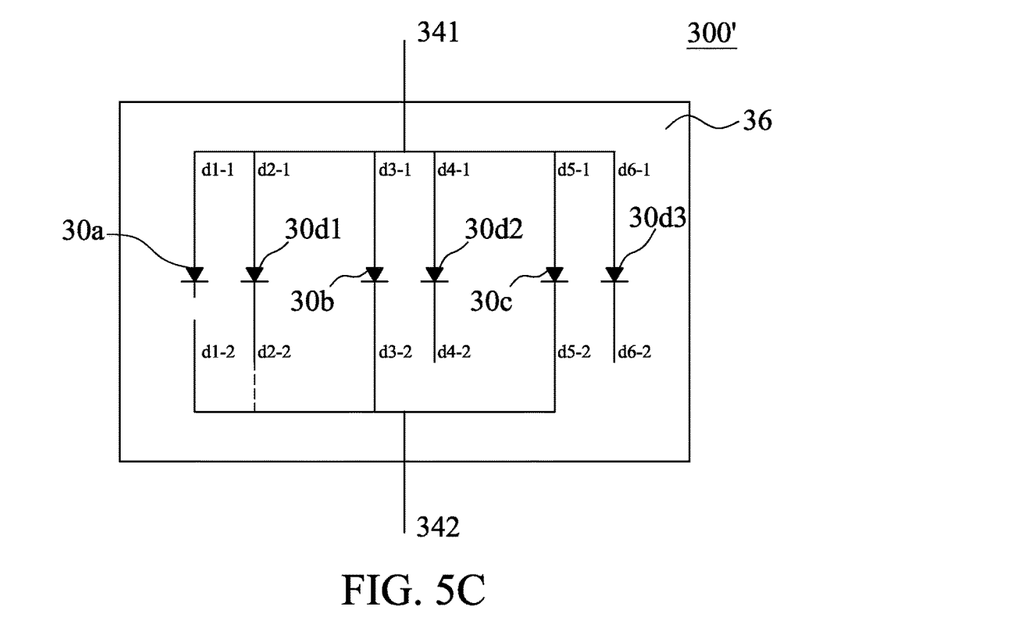

FIG. 5C illustrates an example of forming a replacing circuitry. When one working LED chips is detected in a failure mode, such as the first working LED chip 30a in the first group, the electrical connection of the first working LED chip 30a is designed to be cut off. The fourth wire d2-2 of the first preparative LED chip 30d1 and the second lead 342 are rewired to connect with each other, and the first working LED chip 30a is replaced by the first preparative LED chip 30d1 for light emitting.

In one embodiment, the wires are disposed on the submount 36. The wires of the preparative LED chips can be connected by rewiring process. The method of rewiring includes microjet printing or focused ion beam (FIB) circuit repair. The wires can be cut off by a laser trimming or FIB.

When one of the second or third working LED chips 30b, 30c is failed, the second preparative LED chip 30d2 or the third preparative LED chip 30d3 can replace the malfunctioned working LED chips by the examples described above to make the LED unit 300' keep working normally and correctly. In one embodiment, each group can contain more than two working LED chips or more than two preparative LED chips.

In one embodiment, when the second or third working LED chips 30b, 30c is fail, the second preparative LED chip 30d2 can replace the malfunctioned working LED chips by the examples described above to make the LED unit 300' keep working normally and correctly. Specifically, the second working LED chip 30b and the third working LED chip 30c emit a single color light or variant color lights with similar peak wavelengths, and the second preparative LED chip 30d2 is configured to turned on while the second working LED chip 30b and/or the third working LED chip 30c is failed.

In one embodiment, the failure of the first working LED chip 30a, the second working LED chip 30b or the third working LED chip 30c can be detected by a detection device (not shown) such as probe card, optical inspection after the first working LED chip 30a, the second working LED chip 30b or the third working LED chip 30c formed on the submount 36 with circuit.

In one embodiment, a bridge rectifier may alternatively form on the submount 36 to take the alternating current (AC) provided. The rectifier may rectify the AC to direct current (DC). A zener diode may alternatively be set to breakdown at a voltage level higher than a working voltage of the LED chips. The voltage of the zener diode may be set to a level such that the diode will only turn on when the voltage provided by the ballast exceeds the sum of the voltage stack-up of the nominal closed circuit components at their absolute maximum voltage ratings.

Figure 5D:
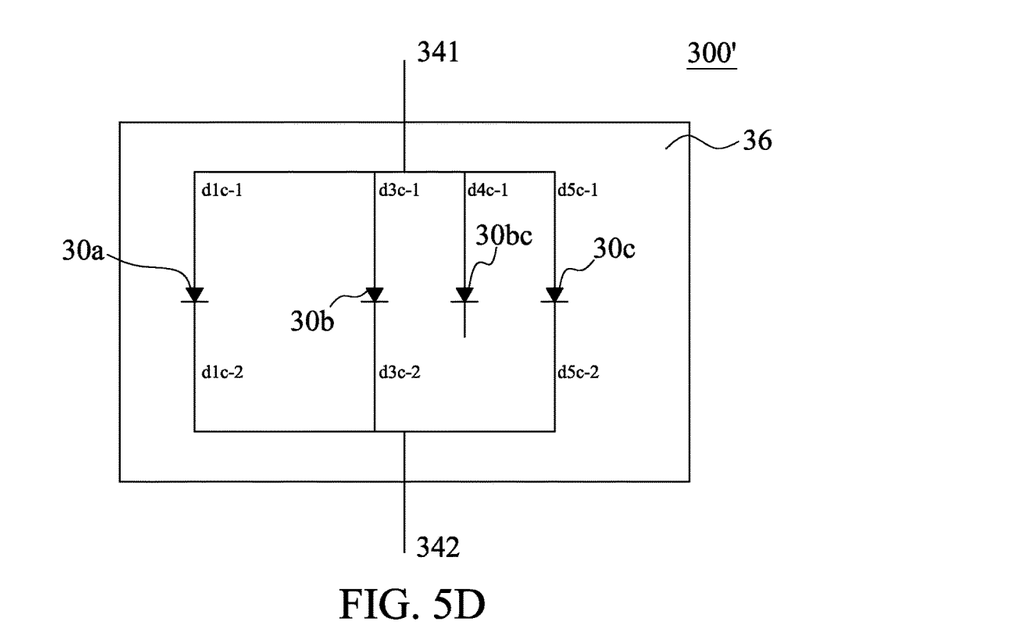
Figure 5E:
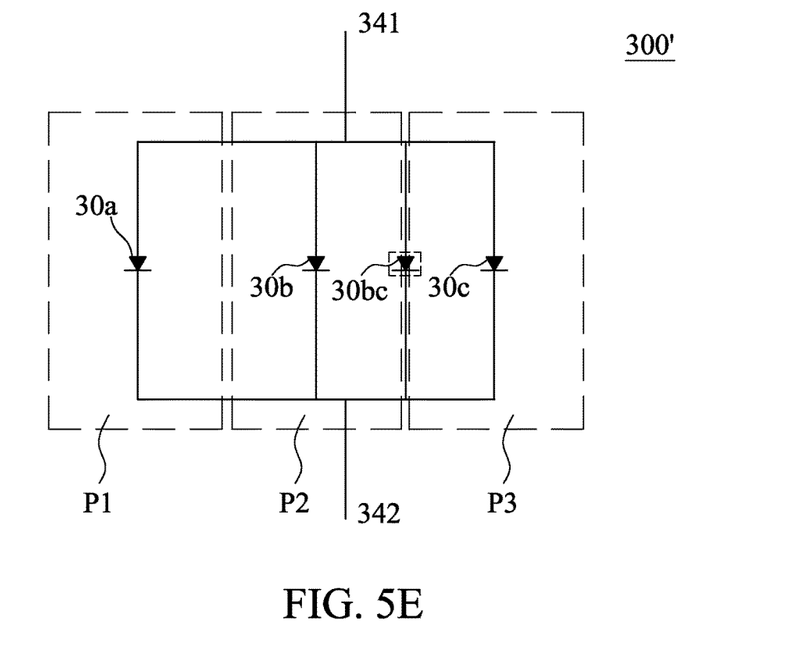

FIGS. 5D-5E show another embodiment in accordance with this application. The first working LED chip 30a is connected to the first lead 341 via the first wire d1c-1 and connected to the second lead 342 via the second wire d1c-2. The second working LED chip 30b is connected to the first lead 341 via the third wire d3c-1 and connected to the second lead 342 via the fourth wire d3c-2. The third working LED chip 30c is connected to the first lead 341 via the fifth wire d5c-1 and connected to the second lead 342 via the sixth wire d5c-2. The preparative LED chip 30bc is connected to the first lead 341 through the seventh wire d4c-1. The LED unit 300' is configured to provide a white light, and the first working LED chip 30a, the second working LED chip 30b and the third working LED chip 30c are designed to be a red light source, a green light source and a blue light source, respectively. Referring to FIG. 5E, a first phosphor layer p1 covers the first working LED chip 30a, a second phosphor layer p2 covers the second working LED chip 30b, and a third phosphor layer p3 covers the third working LED chip 30c. The preparative LED chip 30bc locates between the second working LED chip 30b and the third working LED chip 30c, and the preparative LED chip 30bc is covered by the second phosphor layer p2 and the third phosphor layer p3. The second working LED chip 30b, the third working LED chip 30c and the preparative LED chip 30bc are UV light LEDs to emit UV light. The second phosphor layer p2 covers the second working LED chip 30b and emits green light, and the third phosphor layer p3 covers the third working LED chip 30c and emits blue light. While the second working LED chip 30b is failed, the preparative LED chip 30bc is connected to the second lead 342 via the fourth wire d3c-2 to provide UV light capable of being absorbed by second phosphor layer p2 and emitting green light. In another aspect, while the third working LED chip 30c is failed, the preparative LED chip 30bc is connected to the second lead 342 via the sixth wire d5c-2 to provide UV light capable of being absorbed by the third phosphor layer p3 and emitting blue light. That is, the preparative LED chip 30bc is activated either the second working LED chip 30b or the third working LED chip 30c or the both of them are fail. In another embodiment, the preparative LED chip 30bc can emit a light having a light field larger than the light field from the second working LED chip 30b or the third working LED chip 30c, for example the area of the light field provided by the preparative LED chip 30bc within a specific range is twice larger than the area of the light field provided by the second working LED chip 30b or the third working LED chip 30c. In another embodiment, the preparative LED chip 30bc can have larger light intensity compared with the second working LED chip 30b or the third working LED chip 30c when receiving same amount of current, for example, the lumen per watt provided by the preparative LED chip 30bc is twice larger than the second working LED chip 30b or the third working LED chip 30c. In another embodiment, the preparative LED chip 30bc is designed to receive a current larger than the current provided to the second working LED chip 30b or the third working LED chip 30c, for example, the current provided to the preparative LED chip 30bc is twice larger than the current provided to the second working LED chip 30b or the third working LED chip 30c.

Figure 5F:
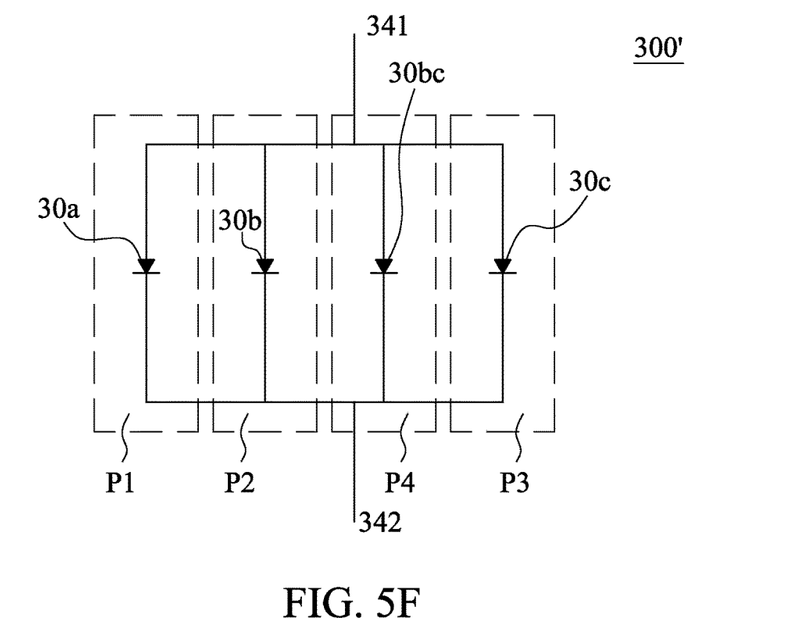

Referring to FIG. 5F, the first phosphor layer p1 covers the first working LED chip 30a to emit red light, the second phosphor layer p2 covers the second working LED chip 30b to emit green light and the third phosphor layer p3 covers the third working LED chip 30c to emit blue light. The preparative LED chip 30bc is covered by the fourth phosphor layer p4, and the fourth phosphor layer p4 contains chemical materials presented in the second phosphor layer p2 or in the third phosphor layer p3. Specifically, the second phosphor layer p2 includes a phosphor to emit a green light, the third phosphor layer p3 includes a phosphor to emit a blue light, and the fourth phosphor layer p4 includes two kinds of phosphors to emit a green light and a blue light. In another embodiment, the fourth phosphor layer p4 includes a material absent from the second phosphor layer p2 and the third phosphor layer p3. In another embodiment, the fourth phosphor layer p4 includes a first material, such as a phosphor comprising Lutetium (Lu) to emit a green light, which is also found in the second phosphor layer p2, and a second material, such as a phosphor comprising Alkaline Silicate to emit a blue light, which is absent from the second phosphor layer p2.

It is noted that, the conversion efficiency of the phosphor layers p1, p2 and p3 are substantially the same compared with each other. The light emitting efficiencies of the LED chips are substantially the same. So, the ratios of the red light, green light, and blue light in the white light can be modified by controlling the ratio of the areas of the phosphor layers. The area of the first phosphor layer p1, the area of the second phosphor layer p2, the area of the third phosphor layer p3 and the area of the fourth phosphor layer p4 can be the same or different. For example, the area of the fourth phosphor layer p4 is larger than the area of the second phosphor layer p2 or the area of the third phosphor layer p3, or the area of the fourth phosphor layer p4 is larger than both of the area of the second phosphor layer p2 and the area of the third phosphor layer p3. Besides, the phosphor layer can be a sheet attached to or a mixture coated on the LED chip.

Figure 6A:
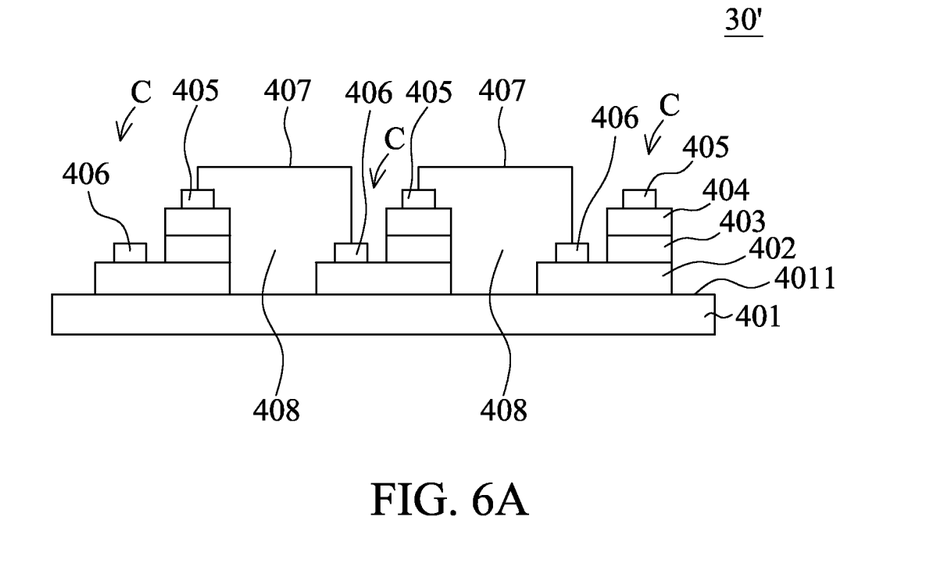
FIG. 6A illustrates a schematic diagram of a multi-junction LED chip of this application.

FIG. 6A illustrates a schematic diagram of a multi-junction LED chip of this application. The multi-junction LED chip 30' has a substrate 401 and more than two epitaxial cells C are formed on the substrate 401, and partial of the upper surface 4011 of the substrate is exposed. Each of the epitaxial cells C includes a first conductivity semiconductor layer 402, an active layer 403, and a second conductivity semiconductor layer 404 formed on the substrate 401 subsequently. In this embodiment, the epitaxial cells C can be electrically connected in series or parallel via a connecting wire 407. The connecting wire 407 connects the first electrode 405 of one of the epitaxial cells C and the second electrode 406 of the adjacent epitaxial cells C into a serial circuits or parallel circuits. There can be air or an insulating layer 408 beneath the connecting wire 407 wherein the insulating layer 408 is formed on the partial surface of the epitaxial cells C and upper surface 4011 of the substrate 401 by CVD, PVD, sputtering and so on before forming the connecting wire 407 to insulate the adjacent epitaxial cells C. The material of the insulating layer 408 can be $Al_2O_3$, $SiO_2$, AlN, $SiN_x$, $TiO_2$, $Ta_2O_5$, or the combination thereof.

Figure 6B:
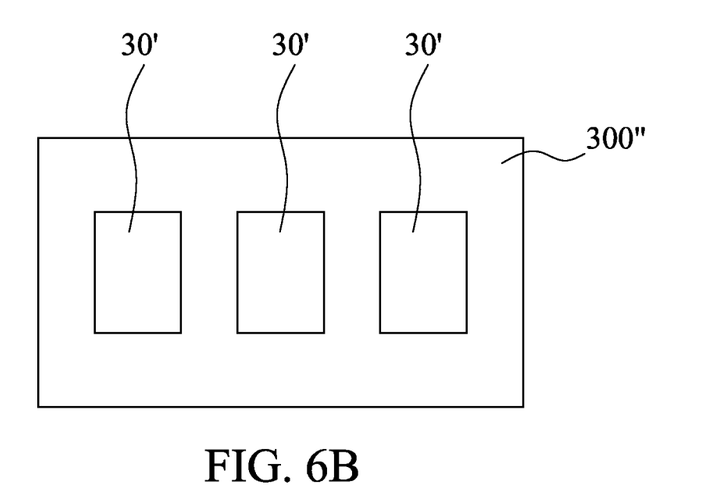
FIG. 6B illustrates a schematic diagram of a third embodiment of the arrangement of a plurality of multi-junction LED chip in an LED unit.

FIG. 6B illustrates a schematic diagram of further embodiment of the arrangement of a plurality of multi-junction LED chip in an LED unit 300". In this embodiment, the quantity of the multi-junction LED chips 30' is a multiple of three. Each of the multi-junction LED chips 30' is connected with each other in parallel and selected to emit different color lights, such as red, green and blue light, and the different color lights of the multi-junction LED chips 30' can be an original light directly emitted from the multi-junction LED chip 30'. In one embodiment, each of the multi-junction LED chips 30' can emit a first light, such as blue or UV light. The first light emitted by part or all of the multi-junction LED chips 30' can be adjusted by different wavelength conversion materials, such phosphor coating or phosphor sheet on LED chips, absorbing the first light emitted by multi-junction LED chips 30', and emitting second light with wavelength spectrums different from that of the first light, such as red, yellow and green light.

By the design of the multi-junction LED chips 30', when one of the epitaxial cells C is malfunctioned, and the other epitaxial cells C are properly functioned to keep the LED unit 300" working to provide the basic functions for lighting. In one embodiment, part or all of the LED chips in above embodiments can be replaced by the multi-junction LED chips 30'.

The first conductive-type semiconductor layer 302, 402 and the second conductive-type semiconductor layer 304, 404 are different in electricity, polarity or dopant, or are different in semiconductor materials used for providing electrons and holes, wherein the semiconductor material layer can be single semiconductor material layer or multiple semiconductor material layers. The polarity can be chosen from any two of p-type, n-type and i-type. The active layer 303, 403 is disposed between the first conductive-type semiconductor layer 302, 402 and the second conductive-type semiconductor layer 304, 404 respectively where the electrical energy and the light energy can be converted. The material of the first conductive-type semiconductor layer 302, 402, the active layer 303, 403, the second active layer (not shown), and the second conductive-type semiconductor layer 304, 404 includes one or more than one element selected form Ga, Al, In, As, P, N, Si. To be more specific, the material of the first conductive-type semiconductor layer 302, 402, the active layer 303, 403, the second conductive-type semiconductor layer 304, 404 and the second active layer (not shown) can be aluminum gallium indium phosphide (AlGaInP) series material, aluminum gallium indium nitride (AlGaInN) series material and so on or ZnO-based material.

The structure of the active layer 303, 403 and the second active layer (not shown) can be single heterostructure (SH), double heterostructure (DH), double-side double heterostructure (DDH) or multi-quantum well (MQW) structure, wherein the wavelength of the light emitted from the active layer 303, 403 and the second active layer (not shown) can be changed by adjusting the number of the pairs of MQW.

In one embodiment, the first electrode 305, 405, the second electrode 406 and the connecting wire 407 can be a single layer or a multi-layer stack. The material of the first electrode 305, 405, the second electrode 406 and the connecting wire 407 can be Cr, Ti, Ni, Pt, Cu, Au, Al, Ag, or its alloy.

The substrate 301, 401 can be a growth or carrying base. The substrate 301, 401 can be an electrically conductive substrate, electrically insulating substrate, transparent substrate, or opaque substrate. The material of the electrically conductive substrate can be metal such as Ge, oxide such as $LiAlO_2$ MgO and ZnO, nitrogen compound such as GaN and AlN, phosphide such as InP, silicon compound such as SiC, Si, or GaAs. The material of the transparent substrate can be chosen from sapphire ($Al_2O_3$), $LiAlO_2$, ZnO, GaN, AlN, glass, diamond, CVD diamond, diamond-like carbon (DLC), spinel ($MgAl_2O_3$), $SiO_x$, or $LiGaO_2$.

A buffer layer (not shown) can be selectively disposed between the first conductive-type semiconductor layer 302, 402 and the substrate 301, 401. The buffer layer is between the two material systems to transit the material system to the semiconductor system layer. For the structure of the light-emitting diode, the buffer layer is used to reduce the crystal mismatch between two materials. On the other hand, the buffer layer can be a single layer structure, multiple layers structure, a structure which includes two materials or two separated structures. The material of the buffer layer can be organic material, inorganic material, metal or semiconductor material. The function of the buffer layer can also be used as a reflector layer, a thermally conductive layer, an electrically conductive layer, an ohmic contact layer, an anti-deformation layer, a stress release layer, a bonding layer, a wavelength conversion layer or a mechanically fixing layer. In one embodiment, the material of the buffer layer can be AlN or GaN, and the buffer layer can be formed by sputtering or atomic layer deposition (ALD).

A contacting layer (not shown) can be selectively formed on a side of the second conductive-type semiconductor layer 304, 404 away from the substrate 301, 401. Specifically, the contacting layer can be optical layer, electrical layer, or the combination thereof. The optical layer can change the radiation or the light from or entering the active layer 303, 403 or the second active layer (not shown) wherein the optical layer can change the frequency, the wavelength, the intensity, the flux, the efficiency, the color temperature, rendering index, light field, angle of view, etc. The electrical layer can change the value of voltage, density of voltage, distribution of voltage applied to the light-emitting chip, resistance, current and capacitance of any two relative sides of the electrical layer. The material of the contacting layer can be conductive oxide, transparent oxide, the oxide with the transparency over 50%, metal with transparency over 50%, organic material, inorganic material, fluoresce material, ceramic, semiconductor material and doping semiconductor material. In some applications, the material of the contacting layer can be InTiO, CdSnO, SbSnO, InZnO, ZnAlO or ZnSnO. In an embodiment, the contacting layer is transparent and has a thickness in a range of 0.005 μm~0.6 μm.

It is noted that, the LED unit in the aforementioned embodiments can be consisted of three working LED chips each of which emits one light selecting from red light, blue light and green light. Or, the LED unit can be consisted of four working LED chips each of which emits one light selecting from red light, blue light, green light, and white light. Thus, the one or more preparative LED chips applied in the LED unit can emit red light, blue light, green light or white light. Besides, the peak wavelength, the light field and the CRI of the light provided by the preparative LED chip can be the same or different compared with the corresponding working LED chip.

The multiple preparative LED chips applied to the LED unit can be chosen to emit light of the same color or different colors. Besides, the LED chips in the LED unit can be arranged, so that one or more preparative LED chips are located between two adjacent working LED chips. One or more preparative LED chips can also locate between one working LED chip and an edge of the LED unit. The light characteristic of the LED unit is changed while the preparative LED chip is turned on. For example, the light intensity of the light provided by the LED unit may vary in a range of about 5% while one working LED chip is replaced by another preparative LED chip. However, the variance of the light intensity is substantially at a range less than 10%, such as 0.2%, 3%, or 8.1%, and the light intensity can decrease or increase. Moreover, in an embodiment, the CRI, color temperature, and the area of light provided by the LED unit may also changes. In one embodiment, the variance of the characteristic is less than 10%, such as 7.8%, 3.4% or 1.5%. While in another embodiment, the variance is between 10% and 20%. Moreover, the light field provided by the LED unit can be changed due to the use of the preparative LED chip.

The working LED chip and the preparative LED chip can be controlled through a switch connected between the corresponding LED chip and the first lead or the second lead. The area of the phosphor layer covered on the working LED chip and the phosphor layer covered on the preparative LED chip can be the same or different. In an embodiment, the difference of the areas between the phosphor layer on the working LED chip and the phosphor layer on the preparative LED chip is less than 50% of the area of the phosphor layer on the working LED chip. Furthermore, the material of the phosphor layer on the working LED chip can be the same as or different from the material of the phosphor layer on the corresponding preparative LED chip. In another embodiment, one phosphor layer on the preparative LED chip contains materials within two or more phosphor layers on the working LED chip nearby.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

The invention claimed is:

1. An LED display, comprising:
   a first end and a second end for power input and output;
   a first LED chip, electrically connected between the first end and the second end, and configured to emit a first light;
   a second LED chip, electrically connected between the first end and the second end, and configured to emit a second light different from the first light in colour; and
   a third LED chip comprising a first node electrically connected to the first end, and a second node,
   wherein the second node of the third LED chip is electrically suspended when the first LED chip is not detected in a failure mode, and
   wherein the second node of the third LED chip is electrically connected to the second end when the first LED chip is detected in the failure mode.

2. The LED display of claim 1, wherein a peak wavelength of the first light is different from that of the second light.

3. The LED display of claim 1, further comprise a bended cover for delivering the first light and the second light therethrough.

4. The LED display of claim 1, wherein the first light and the second light are of different colors.

5. The LED display of claim 1, further comprising a fourth LED chip electrically connected between the first end and the second end and emitting a third light having a peak wavelength different from that of the first light.

6. The LED display of claim 1, wherein the third LED chip locates between the first LED chip and the second LED chip.

7. The LED display of claim 1, further comprising a fourth LED chip electrically connected to the first end and the second end and is configured to emit the second light.

8. The LED display of claim 1, further comprising a switch connected between the first end and the first LED chip.

9. The LED display of claim 1, further comprising a switch having a third node connected to the first end and a fourth node connected to the first LED chip and the third LED chip.

10. The LED display of claim 1, further comprising a first phosphor layer covering the first LED chip and a second phosphor layer covering the second LED chip.

11. The LED display of claim 10, further comprising:
    a fourth LED chip connected to the first end and the second end; and
    a third phosphor layer covering the fourth LED chip.

12. The LED display of claim 11, wherein the third phosphor layer comprises a material absent from the first phosphor layer and the second phosphor layer.

13. The LED display of claim 11, wherein an area of the third phosphor layer is different from that of the first phosphor layer or the second phosphor layer.

14. The LED display of claim 10, further comprising a third phosphor layer covering the third LED chip, and comprising a first phosphor which is also found in the second phosphor layer, and a second phosphor absent from the second phosphor layer.

* * * * *